US010310027B2

(12) United States Patent
Nelson

(10) Patent No.: US 10,310,027 B2
(45) Date of Patent: Jun. 4, 2019

(54) SYSTEMS AND METHODS FOR DETECTING CURRENT USING A KINETIC INDUCTANCE MAGNETIC CURRENT IMAGER

(71) Applicant: The Aerospace Corporation, El Segundo, CA (US)

(72) Inventor: Robert H. Nelson, San Gabriel, CA (US)

(73) Assignee: The Aerospace Corporation, El Segundo, CA (US)

( * ) Notice: Subject to any disclaimer, the term of this patent is extended or adjusted under 35 U.S.C. 154(b) by 263 days.

(21) Appl. No.: 15/625,652

(22) Filed: Jun. 16, 2017

(65) Prior Publication Data

US 2019/0018078 A1 Jan. 17, 2019

(51) Int. Cl.
*H01F 6/04* (2006.01)
*G01R 33/035* (2006.01)
*G01R 15/20* (2006.01)
*G01R 31/26* (2014.01)

(52) U.S. Cl.
CPC ......... *G01R 33/0354* (2013.01); *G01R 15/20* (2013.01); *G01R 31/2601* (2013.01); *H01F 6/04* (2013.01)

(58) Field of Classification Search
CPC ...... G01R 33/0352–0358; H01L 39/00; H01L 39/025; H01L 39/045; H01L 39/223; H01L 39/2493; H03K 19/195; H03K 19/1954; H03K 19/1952
USPC ......... 324/244, 248; 505/162–163, 845–874; 327/527, 528; 257/31–36
See application file for complete search history.

(56) References Cited

U.S. PATENT DOCUMENTS

| | | | | |
|---|---|---|---|---|
| 4,687,987 A * | 8/1987 | Kuchnir | ............. | G01R 19/0061 324/127 |
| 4,848,093 A * | 7/1989 | Simmonds | ................ | F17C 6/00 62/49.1 |
| 4,987,367 A * | 1/1991 | Ishikawa | ................ | G01N 27/72 324/223 |
| 5,021,659 A * | 6/1991 | Schneider | ................ | G01J 5/20 250/336.2 |
| 5,126,568 A * | 6/1992 | Durst | ........................ | G01J 5/30 250/338.1 |

(Continued)

OTHER PUBLICATIONS

Day et al., "A broadband superconducting detector suitable for use in large arrays," Nature 425:817-821 (2003).

(Continued)

*Primary Examiner* — Patrick Assouad
*Assistant Examiner* — Demetrius R Pretlow
(74) *Attorney, Agent, or Firm* — Jones Day

(57) ABSTRACT

Under one aspect, a method for characterizing current of an operating device under test (DUT) includes injecting a signal into a superconducting sensor; determining a property of the superconducting sensor based on the injected signal; disposing the superconducting sensor in spaced relationship to the operating DUT; inducing a magnetic field in the superconducting sensor based on the spaced relationship, the current of the operating DUT, and the injected signal; determining a change in the property of the superconducting sensor resulting from the induced magnetic field; and estimating current of the operating DUT based on the change in the property of the superconducting sensor.

21 Claims, 5 Drawing Sheets

(56) References Cited

U.S. PATENT DOCUMENTS

| | | | | |
|---|---|---|---|---|
| 5,293,119 | A * | 3/1994 | Podney | G01N 27/82 324/241 |
| 6,025,713 | A * | 2/2000 | Morooka | G01R 33/0358 257/31 |
| 6,320,369 | B1 * | 11/2001 | Hidaka | G01R 33/0354 324/117 R |
| 6,420,868 | B1 * | 7/2002 | Ganther, Jr. | G01R 33/0356 324/248 |
| 2002/0106820 | A1 * | 8/2002 | Nikawa | G01R 31/311 438/14 |
| 2005/0057248 | A1 * | 3/2005 | Woods | G01Q 60/54 324/248 |
| 2005/0110484 | A1 * | 5/2005 | Sasaki | H01J 37/244 324/248 |
| 2014/0253111 | A1 * | 9/2014 | Orozco | G01N 27/82 324/240 |
| 2017/0168121 | A1 * | 6/2017 | Yu | A61B 5/05 |

OTHER PUBLICATIONS

Golwala et al., "A WIMP Dark Matter Detector Using MKIDs," J. Low Temp. Phys. 151(1):550-556 (2008).

Khalil et al., "An analysis method for asymmetric resonator transmission applied to superconducting devices," J. Appl. Phys. 111:054510 (2012).

Kher et al., "Kinetic Inductance Parametric Up-Converter," J. Low Temp. Phys. 1-6 (2015).

Lindeman et al., "Arrays of membrane isolated yttrium-barium-copper-oxide kinetic inductance bolometers," J. Appl. Phys. 115:234509 (2014).

Luomahaara et al., "Kinetic inductance magnetometer," Nat. Commun. 5:4872 (2014).

Swenson et al., "Operation of a titanium nitride superconducting microresonator detector in the nonlinear regime," J. Appl. Phys. 113:104501 (2013).

* cited by examiner

SYSTEMS AND METHODS FOR DETECTING CURRENT USING A KINETIC INDUCTANCE MAGNETIC CURRENT IMAGER

FIELD

This application generally relates to systems and methods for detecting current using a kinetic inductance magnetic current imager.

BACKGROUND

Superconducting quantum interference devices (SQUIDs) are commonly used for magnetic current imaging of semiconductor devices. In order to achieve high sensitivity current tracing of a semiconductor device under test (DUT), both the SQUID and the DUT are cooled to cryogenic temperatures. Such low temperatures can be outside of the nominal operating temperature of the DUT which can impact device performance. SQUIDs can also utilize a looped inductor design that can cause unintentional capacitive coupling in the inductor windings.

SUMMARY

Under one aspect, a method for characterizing current of an operating DUT can include injecting a signal into a superconducting sensor; determining a property of the superconducting sensor based on the injected signal; disposing the superconducting sensor in spaced relationship to the operating DUT; inducing a magnetic field in the superconducting sensor based on the spaced relationship, the current of the operating DUT, and the injected signal; determining a change in the property of the superconducting sensor resulting from the induced magnetic field; and estimating current of the operating DUT based on the change in the property of the superconducting sensor.

Optionally, the method further includes scanning, via two-dimensional movement of a stage, the operating DUT with the superconducting sensor.

As additional or alternative options, the property can include at least one of a quality factor, a resonant frequency, and a capacitance.

Optionally, determining the property can include: measuring a forward gain of the superconducting sensor; determining a resonant frequency based on the measured forward gain; determining a quality factor and a capacitance based on the determined resonant frequency; and determining a magnitude of the induced magnetic field based on the determined resonant frequency, the determined quality factor, and the determined capacitance.

Additionally, or alternatively, the superconducting sensor can include a resonant circuit defined in a superconducting film. The resonant circuit includes an interdigitated capacitor and an inductor electrically coupled in parallel.

As additional or alternative options, the superconducting sensor is capacitively coupled to a transmission line transporting the injected signal. Another superconducting sensor is capacitively coupled to the transmission line in parallel with the superconducting sensor. Optionally, the method can further include multiplexing a collective output current of the superconducting sensor and the another superconducting sensor.

Additionally, or alternatively, the injected signal comprises a broadband radio frequency range.

Optionally, the method further includes disposing the operating DUT in a vacuum chamber at a nominal operating temperature of the operating DUT.

Under another aspect, a system for characterizing current of an operating DUT includes a superconducting sensor; a cryocooler configured to dispose the superconducting sensor in spaced relationship to the operating DUT, the spaced relationship inducing a magnetic field in the superconductor sensor; a vacuum chamber enclosing the superconducting sensor and the operating device under test; and a controller configured to: inject a signal into the superconducting sensor; determine a property of the superconducting sensor based on the injected signal; determine a change in the property of the superconducting sensor resulting from the induced magnetic field; and estimate current of the operating DUT based on the change in the property of the superconducting sensor. The induced magnetic field can be based on the spaced relationship, the current of the operating DUT, and the injected signal Optionally, the controller can be further configured to scan, via two-dimensional movement of a stage, the operating DUT with the superconducting sensor.

Additionally, or alternatively, the property can include at least one of a quality factor, a resonant frequency, and a capacitance.

Additionally, or alternatively, the superconducting sensor can include a resonant circuit defined in a superconducting film.

As additional or alternative options, the resonant circuit includes an interdigitated capacitor and an inductor electrically coupled in parallel.

Additionally, or alternatively, the superconducting sensor can be capacitively coupled to a transmission line transporting the injected signal.

Additionally, or alternatively, the injected signal comprises a broadband radio frequency range.

Optionally, the controller is further configured to dispose the operating DUT in a vacuum chamber at a nominal operating temperature of the operating DUT.

As additional or alternative options, another superconducting sensor is capacitively coupled to the transmission line in parallel with the super conducing sensor.

Optionally, the controller is further configured to multiplex a collective output current of the superconducting sensor and the another superconducting sensor.

BRIEF DESCRIPTION OF THE DRAWINGS

Like reference symbols in the various drawings indicate like elements.

DETAILED DESCRIPTION

Figure 1:
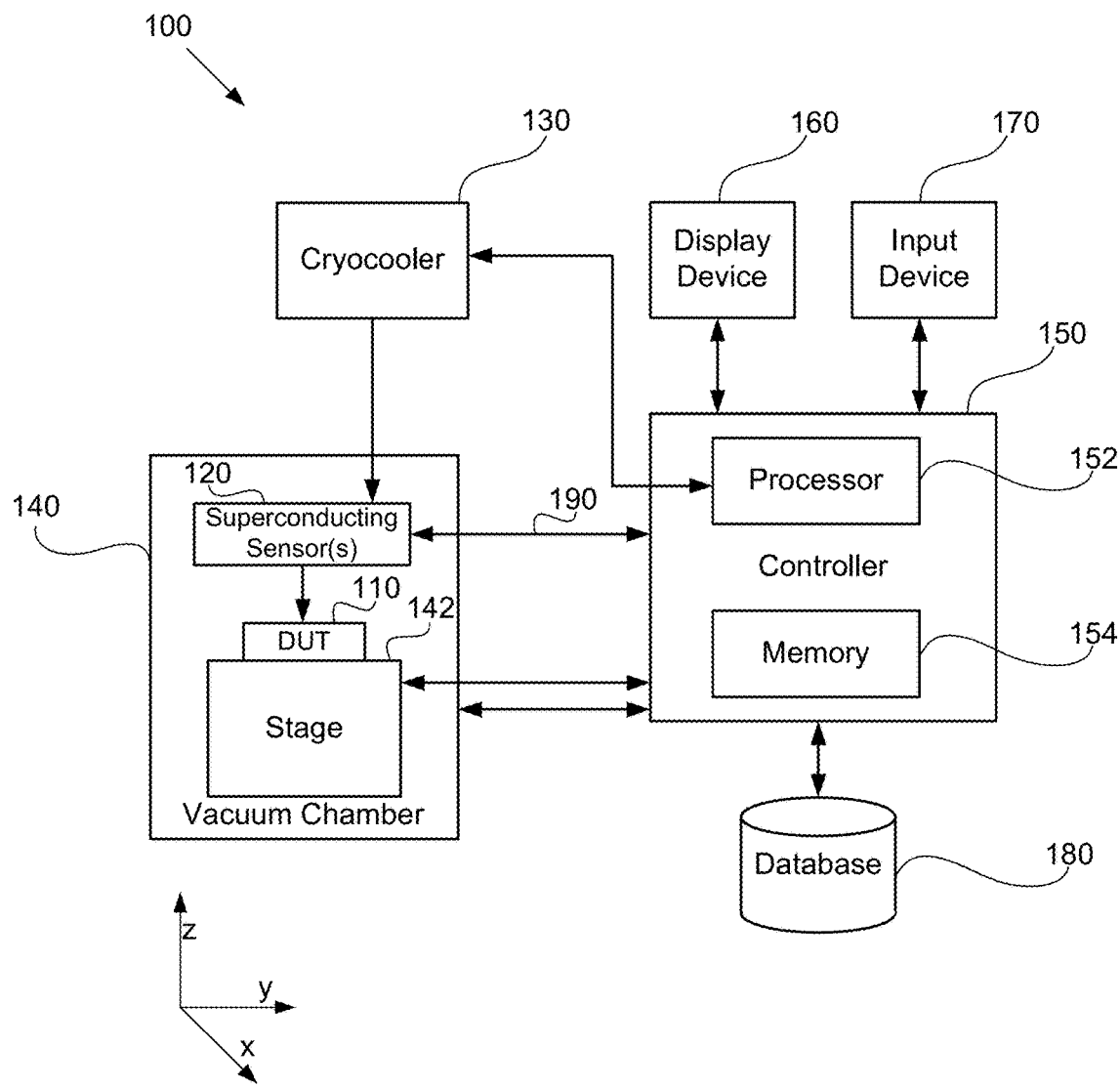
FIG. 1 schematically illustrates an exemplary system for characterizing current of an operating DUT, according to one exemplary configuration.

Systems and methods are provided herein for characterizing current of an operating DUT. For example, a superconducting high-quality inductor capacitor (LC) resonator is sensitive to magnetic fields at a level potentially more sensitive than SQUIDs. Use of superconducting high-quality LC resonators can provide for current imaging during nominal temperature device operation of the DUT. SQUIDs, unlike superconducting high-quality LC resonators, can require the DUT to operate at low temperatures which may be outside of the DUT's nominal operating temperature range. Employing superconducting sensors, such as kinetic inductance magnetic current imager elements (KIMCIEs) as magnetic flux sensors can provide a high-resolution, non-destructive current imager. These superconducting sensors can be used to inspect current of operating DUTs, such as semiconductor devices. Such inspection can provide insight into faults within the DUT or even device component counterfeiting, for example. Additionally, multiplexing in the frequency domain of these superconducting sensors can be done by tuning each sensor to a separate frequency which allows for an entire array of superconducting sensors to be read-out through a single input and output transmission line. Each superconducting sensor of the array acts as a pixel to measure magnetic flux of the DUT. The resulting map of measured magnetic flux over an operating DUT allows for the characterization of the electric current flowing through the DUT. Current of an operating DUT can be estimated by measuring the magnetic field of the operating DUT with any suitable number of superconducting sensors, or even a single superconducting sensor.

Various physical relationships and mathematical expressions can characterize behaviors of superconductor sensors. For example, a superconductor can prevent or inhibit magnetic flux from penetrating into its bulk substrate via the Meissner effect. The magnetic flux through a superconducting loop can be expressed as:

$$(L_g + L_K)I - \Phi_{ext} - m\Phi_0 = 0, \quad (1)$$

where $L_g$ is a geometric inductance, $L_k$ is a kinetic inductance, I is the screening current, $\Phi_{ext}$ is the flux from an external field, $\Phi_0$ is a flux quantum constant of 2.07 fWb, and $m \in Z^+$ quantizes the amount of trapped flux with m as an integer within a set of positive integers, $Z^+$ (e.g., 1 to 10, 5 to 500, or 450 to 150000). Due to the Meissner effect, superconductors respond to static magnetic fields, where as a normal conductor would only see dynamic magnetic fields resulting from Faraday's law. The kinetic inductance of a superconducting loop is non-linear and can be approximated by the following equation:

$$L_K = L_0 \left(1 + \frac{I^2}{I_s^2}\right), \quad (2)$$

where $L_0$ is the kinetic inductance of the superconducting loop in the linear regime, $I_S$ is a scaling factor, and I is the screening current. A forward gain, $S_{21}$, can be determined using the following equation:

$$S_{21} = 1 - \frac{Q}{Q_c} \frac{1}{1 + 2jQx}, \quad (3)$$

where $Q_c$ is a coupling quality factor, x is a fraction frequency difference expressed as:

$$x = \frac{(f - f_0)}{f_0}, \quad (4)$$

where $f_0$ is a resonant frequency expressed as:

$$f_0 \cong \frac{1}{2\pi\sqrt{LC}}, \quad (5)$$

L is the resonator's total inductance, C is the resonator's total capacitance, and Q is the total quality of the resonator expressed as the following relationship:

$$\frac{1}{Q} = \frac{1}{Q_i} + \frac{1}{Q_c}, \quad (6)$$

where $Q_i$ is an unloaded intrinsic quality factor of the resonator.

An overview of exemplary systems for characterizing current of an operating DUT will be described. An exemplary method for characterizing current of an operating DUT will also be described. Additionally, some illustrative performance characteristics of exemplary superconducting sensors suitable for use in the present systems and methods will be described.

FIG. 1 schematically illustrates an exemplary system for characterizing current of an operating DUT 110, according to one exemplary configuration. System 100 includes a superconducting sensor 120 disposed in spaced relationship to operating DUT 110; a cryocooler 130; a vacuum chamber 140 enclosing the superconducting sensor and the operating DUT 110; and a controller 150. Controller 150 can be configured to inject a signal into the superconducting sensor 120; determine a property of the superconducting sensor 120 based on the injected signal; dispose the superconducting sensor 120 in spaced relationship to the operating DUT 110; induce a magnetic field in the superconducting sensor 120 based on the spaced relationship and the current of the DUT 110; determine a change in the property of the superconducting sensor 120 resulting from the induced magnetic field; and estimate current of the operating DUT 110 based on the change in the property of the superconducting sensor 120. System 100 can include any suitable number of superconducting sensors 120, such as a single superconducting sensor 120 or an array of superconducting sensors 120.

In some variations, operating DUT 110 can be disposed on stage 142 within vacuum chamber 140 at a nominal operating temperature of the operating DUT 110. Cryocooler 130 can cool superconducting sensor 120 to a suitable cryogenic temperature range, such as 0 K to 10 K, 4 K to 20

K, 10 K to 150 K, 2 K to 100 K, and 90 K to 200 K. Disposal of operating DUT 110 and superconducting sensor 120 within vacuum chamber 140 can inhibit condensation buildup and/or other environmental aspects resulting from a temperature differential between the superconducting sensor 120 and the operating DUT 110.

Microwave kinetic inductance detectors (MKIDs) are a type of superconducting sensor that have been used in sub-mm astronomy and dark matter direction detection experiments. These devices use quasi-particle absorption to change the inductance of a superconducting high-Q LC resonator. By monitoring the frequency shift caused by the change in inductance, these sensors can measure how much energy is deposited by quasi-particles. These sensors can be multiplexed in the frequency domain by respectively tuning MKIDs in an array of MKIDs to individual frequencies. For details of exemplary uses of MKIDS, see the following references, the entire contents of which are incorporated by reference herein: Golwala, S. R. et al., "A WIMP Dark Matter Detector Using MKIDs," J. of Low Temp. Phys., 151, 1, 550-556 (2008); Day, P. K., et al., "A broadband superconducting detector suitable for use in large arrays," Nature, 425, 817-821 (2003).

Superconducting sensor 120 can be or include, for example, a KIMCIE and/or an MKID. KIMCIEs differ from typical MKIDs in number of ways. For example, KIMCIEs are designed to monitor magnetic fields as opposed to quasi-particle absorption. KIMCIEs can have a larger surface area of inductors than MKIDs. KIMCIEs can operate at lower frequencies (e.g., 100 MHz to 250 MHz, 200 MHz to 500 MHz, or 450 MHz to 999 MHz) whereas SQUIDs typically operate at higher frequencies (e.g., 10 GHz to 30 GHz, 15 GHz to 50 GHz, 45 GHz to 100 GHz). Additionally, KIMCIEs can use superconductor materials that operate at higher temperatures such as 1 K to 10 K, 4 K to 20 K, 10 K to 150 K, 2 K to 100 K, or 90 K to 200 K. Superconducting sensor 120 can be positioned so as to be suitably cooled by a cool tip of cryocooler 130. Controller 150 can interface with cryocooler 130 to provide various controls and commands for operating cryocooler 130. Cryocooler 130 can cool the superconducting sensor 120 to its operating temperature which can be selected based on the superconducting material and configuration of superconducting sensor 120. A detailed description of an exemplary superconducting sensor 120 is discussed below with reference to FIG. 2A.

Superconducting sensor 120 can be configured to interface with controller 150 via transmission line 190. For example, a signal generated by controller 150 can be injected into superconducting sensor 120 via transmission line 190. Such a signal can include frequencies within a broadband radio frequency range (e.g., 10 MHz to 150 MHz, 75 to 500 MHz, 100 MHz to 1500 MHz, or 1000 MHz to 2500 MHz). The injected signal drives operation of the superconducting sensor 120. A property of superconducting sensor 120 can be determined based on the injected signal. For example, controller 150 can monitor a forward gain of the superconducting sensor 120 when the superconducting sensor is substantially spatially separated from operating DUT 110, and/or when DUT 110 is turned off, such that no magnetic fields are induced within superconducting sensor 120 as a result of proximity to operating DUT 110.

Once a property, e.g., a forward gain, of superconducting sensor 120 is determined based on the injected signal, the superconducting sensor 120 can be disposed in a spaced relationship over the operating DUT and/or the DUT can be turned on. Such positioning can be done, for example, by positioning movable stage 142 such that the operating DUT 110 is spatially separated enough from 120 so as to induce a magnetic field between the operating DUT 110 and superconducting sensor 120. Current within both superconducting sensor 120 and operating DUT 110 create induced magnetic fields in each other. These magnetic fields create screening currents within superconducting sensor 120 and operating DUT 110 due to the Meissner effect such as described above. The screening currents in turn change the kinetic inductance, $L_k$, of Equation 2 through the nonlinear term. The change in this kinetic inductance causes the resonant frequency, $f_0$, and quality factors of the superconducting sensor 120 to change. These changes resulting from the induced magnetic field can be determined through monitoring of the forward gain, $S_{21}$, of Equation 3. The forward gain of superconducting sensor 120 can be suitably monitored, e.g., with spectrum and/or network analyzer capabilities of controller 150. The magnitude of the induced magnetic field can be extracted from the forward gain, $S_{21}$, based on determined values of $f_0$, Q, and $Q_c$. Such extraction can be done, for example, by processor 152 of controller 150. Current through the operating DUT can be estimated from the induced magnetic field using Equation 1. In some variations, stage 142 can be moved in two-dimensions such that the superconducting sensor 120 can scan operating DUT 110.

Additionally, in some variations, controller 150 can include a processor 152 and a memory 154. The memory may temporarily or permanently store instructions that cause at least one processor to perform one or more of the operations described herein. In addition, methods can be implemented by one or more data processors 152 either within a single computing system or distributed among two or more computing systems. Such computing systems can be connected and can exchange data and/or commands or other instructions or the like via one or more connections, including but not limited to a connection over a network (e.g., the Internet, a wireless wide area network, a local area network, a wide area network, a wired network, or the like), via a direct connection between one or more of the multiple computing systems, etc. Controller 150 can communicate with display device 160. Display device 160 can provide results of the estimation described herein through display to a user, e.g., using a suitable display, such as an LCD or LED display. Controller 150 can receive input from one or more users via input device 170 to control, for example, the injected signal. Results from the estimation or other calculation parameters such as electrical equation constants can be stored in database 180. Database 180 can be configured to interface with controller 150 to exchange such results and calculation parameters.

Figure 2A:
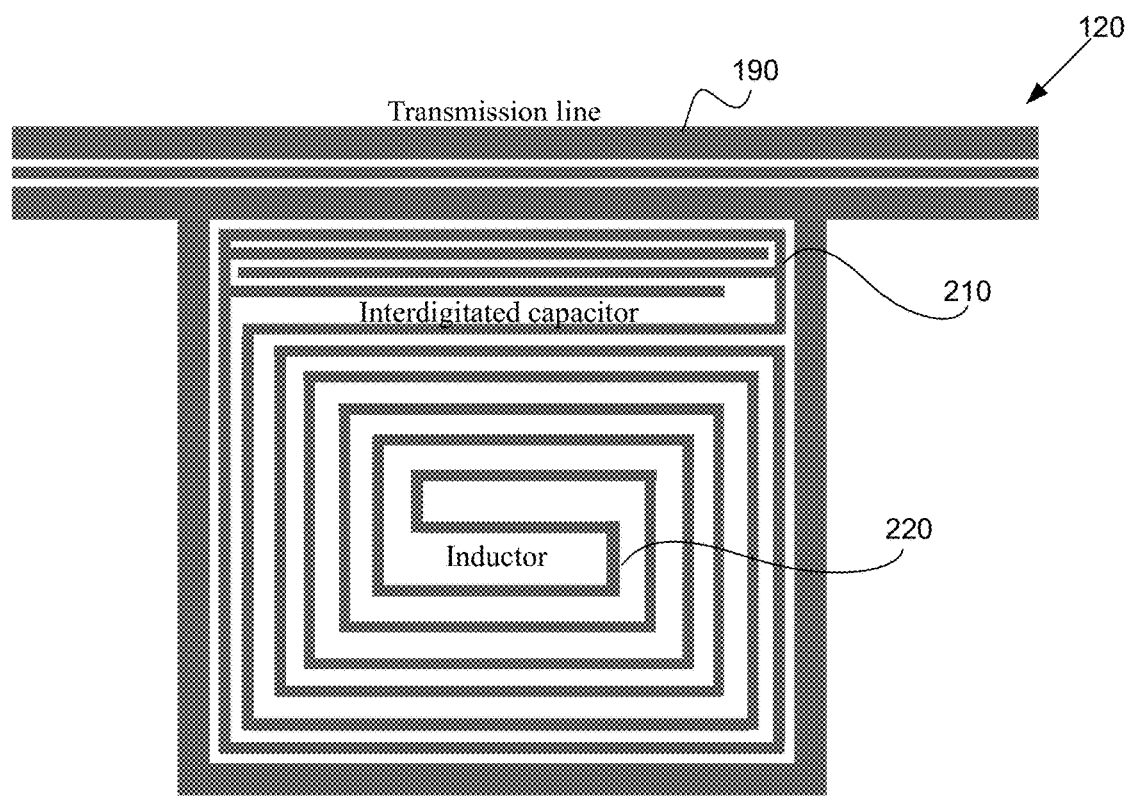
FIGS. 2A-2B schematically illustrate an exemplary superconducting sensor that can be used in the system of FIG. 1, according to one exemplary configuration.

FIG. 2A schematically illustrates components of an exemplary superconducting sensor 120 that can be used in the system 100 of FIG. 1, according to one exemplary configuration. Superconducting sensor 120 can include a high-Q LC resonator that has a non-linear kinetic inductance. For example, a high-Q LC resonator can include an interdigitated capacitor 210 and a spiraled inductor 220 electrically coupled to transmission line 190. Interdigitated capacitor 210, inductor 220, and transmission line 190 can be patterned within a superconducting film deposited on a substrate. Inductor 220 can include a spiral inductor design so as to reduce crosstalk between an array of superconducting sensors 120. In comparison, use of a loop inductor for an array of sensors, for example, can introduce crosstalk as a result of unintended capacitive coupling of the superconducting sensors within an array.

Superconducting sensor 120 can include a resonant circuit including interdigitated capacitor 210 and inductor 220 patterned in a single-layer or multi-layer superconducting film e.g., a freestanding superconducting wafer. The film can include one or more superconductor materials, such as yttrium-barium-copper-oxide (YBCO). YBCO has a critical temperature ($T_c$) of approximately 90 K. Using YBCO, the superconducting sensor 120 can operate at cryogenic temperatures where the quality factor of the semiconductor materially asymptotes, such as 1 K to 10 K, 4 K to 20 K, 10 K to 150 K, 2 K to 100 K, or 90 K to 200 K. For details on YBCO, see the following reference, the entire contents of which is incorporated by reference herein: Lindeman, M. A., et al., "Arrays of membrane isolates yttrium-barium-copper-oxide kinetic inductance bolometers," J. of App. Phys., 115, 234509 (2014). The YCBO can be relatively thin (e.g., 75 nm to 150 nm, or 125 nm to 200 nm). A non-exhaustive list of other materials superconducting sensor 120 can include TiN, NbN, or TiNbN. TiNbN or NbN can operate at approximately 4.2 K.

Figure 2B:
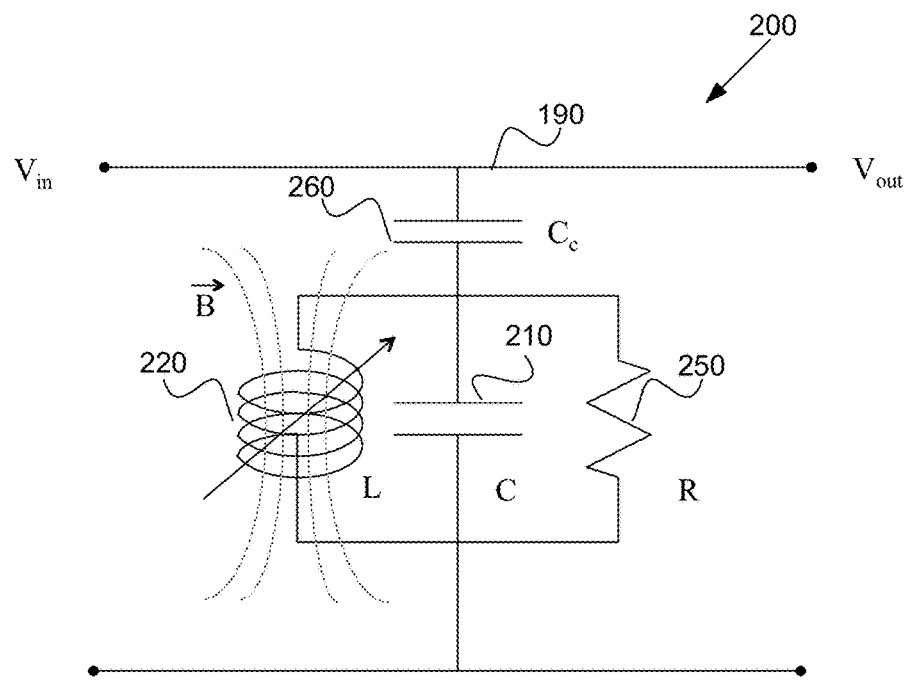

FIG. 2B is an electrical schematic 200 of an equivalent circuit representing an exemplary superconducting sensor 120 of FIG. 2A, according to one example. Superconducting sensor 120 can be represented by a parallel inductor-resistor-capacitor (LRC) circuit having an inductor 220, capacitor 230, and resistor 250 electrically represented in parallel. Superconducting sensor 120 can be capacitively coupled via capacitor 260. An effective resistance, R, of resistor 250 can be determined based on the unloaded intrinsic quality factor, $Q_i$, and expressed as:

$$R = Q_i \sqrt{\frac{L}{C}}, \quad (7)$$

where L is the inductance of inductor 220 and C is the capacitance of interdigitated capacitor 210.

Figure 3A:
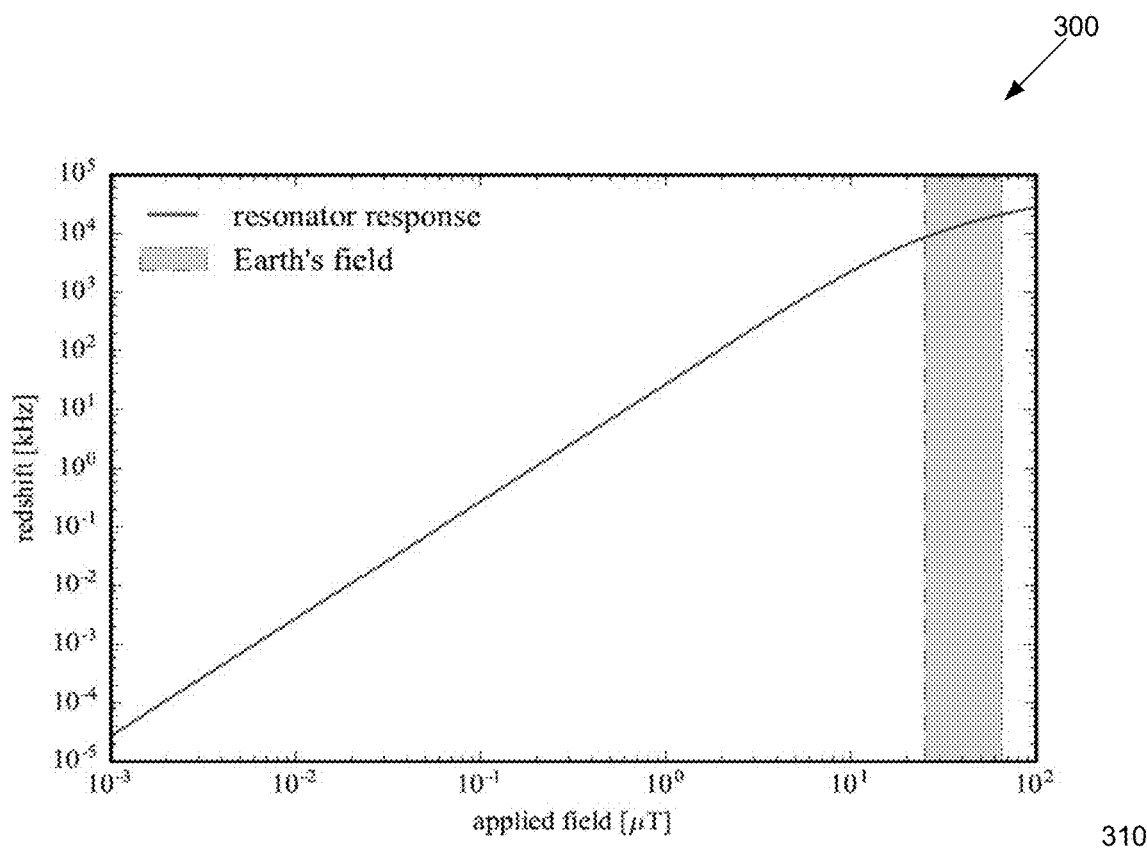
FIG. 3A is a plot illustrating expected frequency redshift of an applied magnetic field of a superconducting sensor, according to one example.

FIG. 3A is a plot 300 illustrating expected frequency redshift of an applied magnetic field of a superconducting sensor 120, according to one example. As illustrated, the Earth's magnetic field is orders of magnitude greater than an expected sensitivity of a superconducting sensor 120. For a given magnetic field, a resonance of inductor 220 can shift down in frequency following the resonator response plot line of plot 300. As a result, inductor 220 may need to be shielded for effects resulting from the Earth's magnetic field.

Figure 3B:
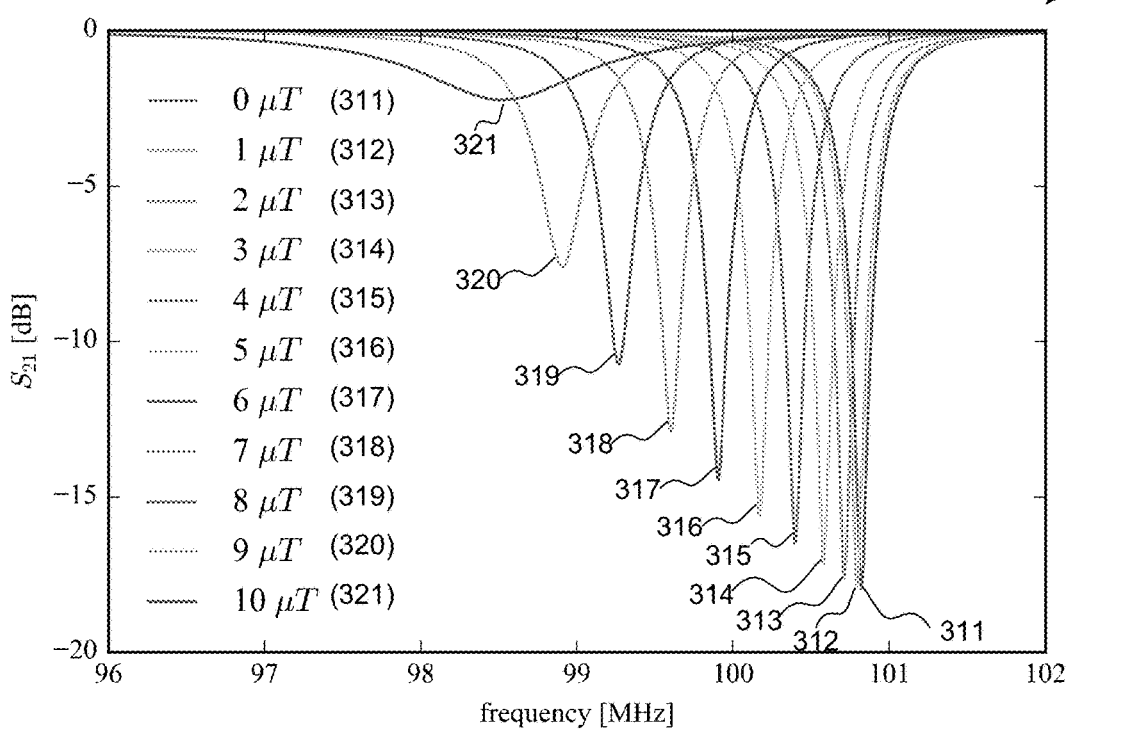
FIG. 3B is a plot illustrating frequency response variations in forward gain of a superconducting sensor that can be generated based on applied magnetic fields illustrated in FIG. 3A, according to one example.

FIG. 3B is a plot 310 illustrating frequency response variations in forward gain, $S_{21}$, of a superconducting sensor 120 that can be generated based on varying applied magnetic fields such as illustrated in FIG. 3A. The forward gain, $S_{21}$, illustrates the transmitted frequency spectrum of the superconducting sensor 120. For example, an applied magnetic field of approximately 0 µT can result in the frequency response of superconducting sensor 120 illustrated by plot line 311. In another example, an applied magnetic field of approximately 1 µT can result in the frequency response of superconducting sensor 120 illustrated by plot line 312. Plot line 313 illustrates an exemplary frequency response of superconducting sensor 120 resulting from an applied magnetic field of approximately 2 µT. Application of a magnetic field of approximately 3 µT can result in a frequency response of superconducting sensor 120 as illustrated by plot line 314. In yet another example, an applied magnetic field of approximately 4 µT can result in a frequency response of superconducting sensor 120 as illustrated by plot line 315. Plot line 316 illustrates another exemplary frequency response of superconducting sensor 120 resulting from an applied magnetic field of approximately 5 µT. An applied magnetic field of approximately 6 µT can result in a frequency response of superconducting sensor 120 as illustrated by plot line 317. Applying a magnetic field of approximately 7 µT can result in a frequency response of superconducting sensor 120 as illustrated by plot line 318. Plot line 319 illustrates another exemplary response of superconducting sensor 120 resulting from an applied magnetic field of approximately 8 µT. In another example, an applied magnetic field of approximately 9 µT can result in a frequency response of superconducting sensor 120 as illustrated by plot line 320. Application of a magnetic field of approximately 10 µT can result in a frequency response of superconducting sensor 120 as illustrated by plot line 321.

Figure 4A:
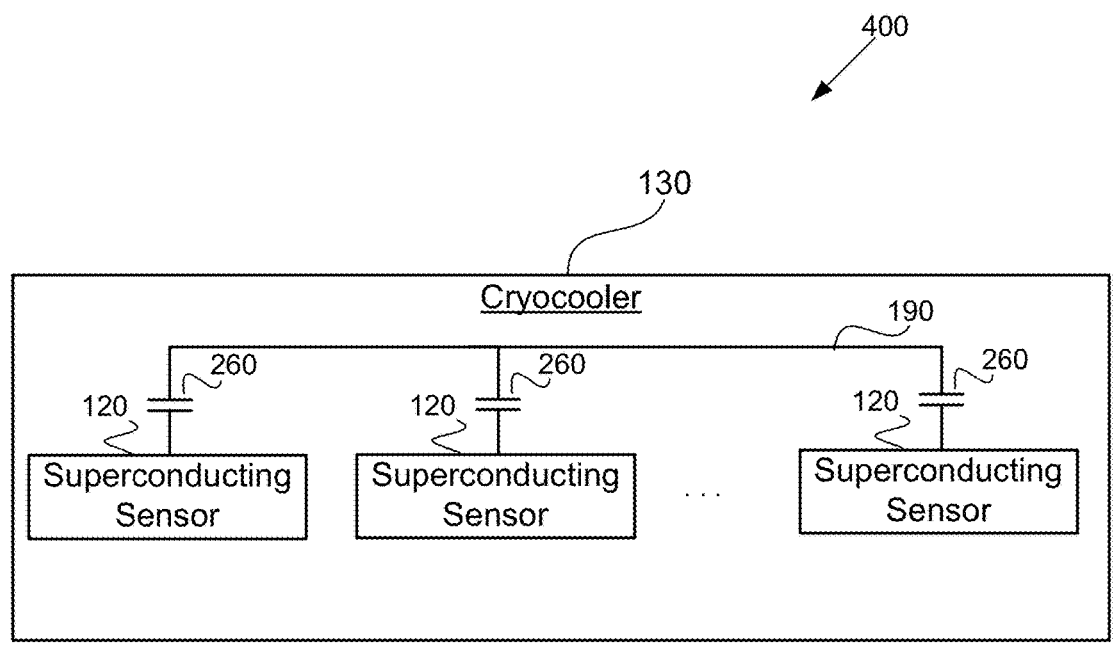
FIG. 4A schematically illustrates an exemplary subsystem for multiplexing a signal output of an array of superconducting sensors that can be used in the system of FIG. 1, according to one exemplary configuration

FIG. 4A schematically illustrates an exemplary subsystem 400 for multiplexing a signal output of an array of superconducting sensors 120 that can be used in the system of FIG. 1, according to one exemplary configuration. In subsystem 400, output signals of two or more superconducting sensors 120 can be multiplexed together on transmission line 190 through capacitively coupling each superconducting sensor 120 to transmission line 190 via a respective capacitor 260. Two or more superconducting sensors 120 can be densely packed on a cool tip of cryocooler 130. Each superconducting sensor 120 can act as a pixel for measuring the magnetic flux of the operating DUT 110.

Figure 4B:
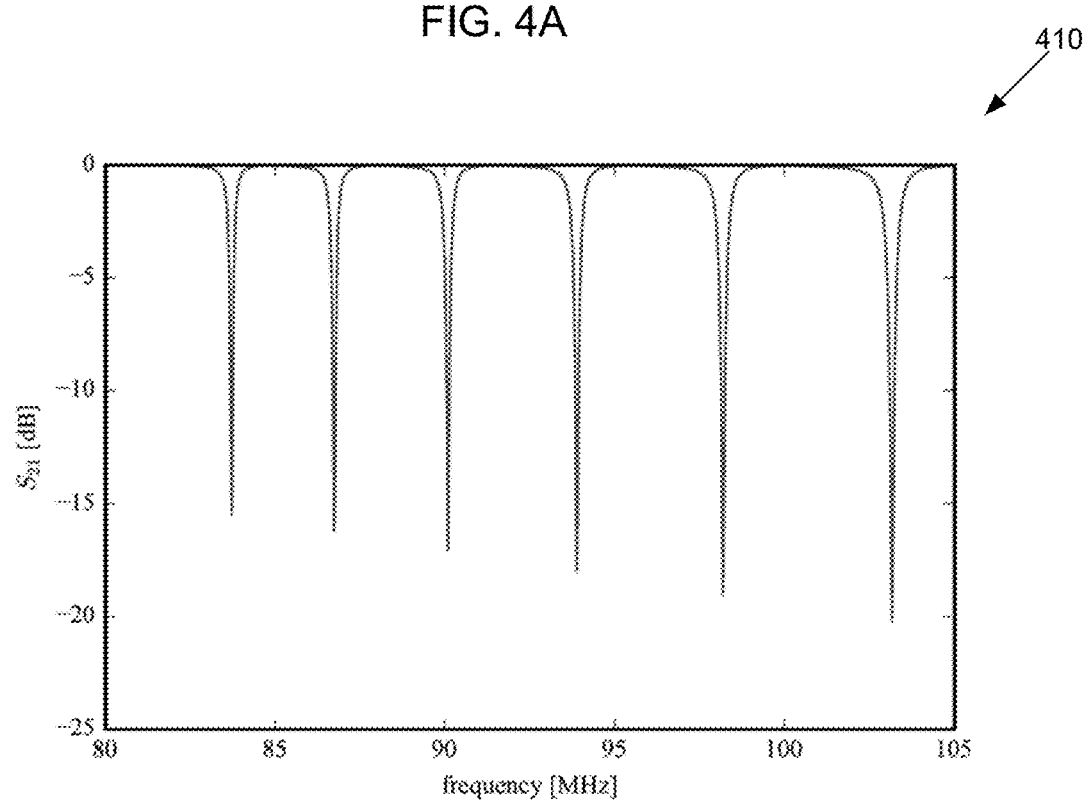
FIG. 4B is a plot illustrating a multiplexed frequency response of two or more superconducting sensors configured such as illustrated in FIG. 4A, according to one example.

FIG. 4B is a plot 410 illustrating a multiplexed frequency response of two or more superconducting sensors configured such as illustrated in FIG. 4A. An array of superconducting sensors 120 multiplexed together, each superconducting sensor 120 can be tuned to a different resonant frequency value. The array of superconducting sensors 120 can be simultaneously monitored via transmission line 190 to produce, for example, a frequency plot as illustrated in FIG. 4A.

Figure 5:
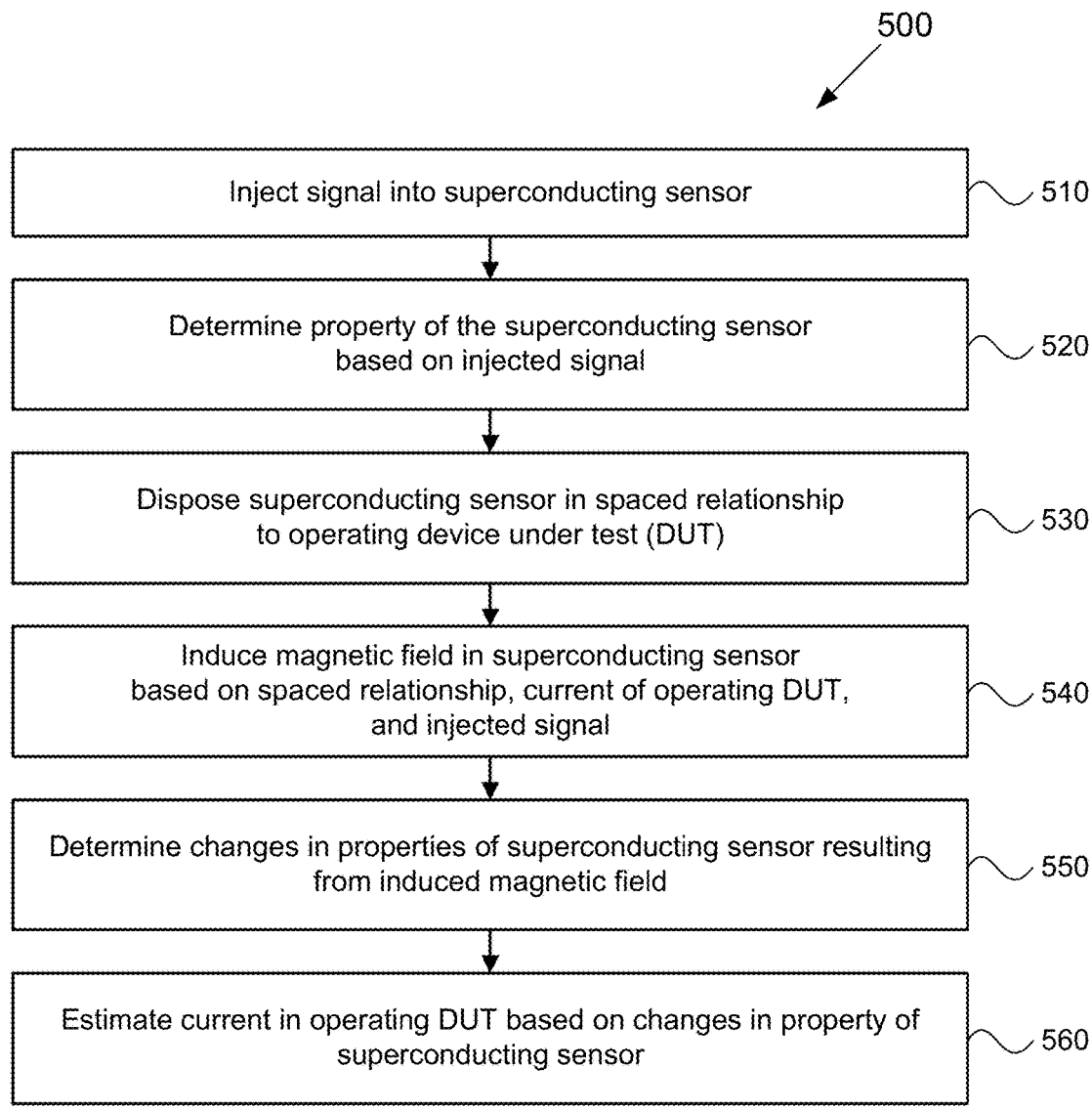
FIG. 5 illustrates steps in an exemplary method for characterizing current of an operating DUT, according to one example.

FIG. 5 illustrates steps in an exemplary method 500 for characterizing current of an operating DUT, according to one example. At step 510, a signal is injected into a superconducting sensor. Exemplary superconducting sensors are provided elsewhere herein, e.g., with reference to FIGS. 2A-2B.

At step 520, a property of the superconducting sensor is determined based on the injected signal. The property can include, for example, at least one of a quality factor, a resonant frequency, or a capacitance, which are described above in FIG. 1. The capacitance can be of the interdigitated capacitor 210, as described above in FIGS. 2A-2B.

At step 530, the superconducting sensor is disposed in a spaced relationship to the operating DUT, such as described above with reference to FIG. 1. At 540, a magnetic field is induced in the superconducting sensor based on the spaced relationship, the current of the operating DUT, and the injected signal. At 550, a change in the property of the superconducting sensor resulting from the induced magnetic field are determined.

At 560, the current of the operating DUT is estimated based on the change in the property of the superconducting sensor. Such processing can include using a dedicated circuit or a computer. The results of such estimation can be displayed to a user, e.g., using a suitable display device 160, such as an LCD or LED display, or can be stored in a non-transitory computer-readable medium. It should be appreciated that a variety of suitable hardware and software configurations can be used so as to perform such current estimation.

While preferred embodiments of the invention are described herein, it will be apparent to one skilled in the art that various changes and modifications may be made. For example, it should be apparent that the systems and methods provided herein suitably may be used to perform any suitable type of current characterization. The appended claims are intended to cover all such changes and modifications that fall within the true spirit and scope of the invention.

What is claimed:

1. A method for characterizing current of an operating device under test (DUT), the method comprising:
injecting a signal into a superconducting sensor;
determining a property of the superconducting sensor based on the injected signal;
disposing the superconducting sensor in spaced relationship to the operating DUT;
inducing a magnetic field in the superconducting sensor based on the spaced relationship, the current of the operating DUT, and the injected signal;
determining a change in the property of the superconducting sensor resulting from the induced magnetic field; and
estimating current of the operating DUT based on the change in the property of the superconducting sensor.

2. The method of claim 1, further comprising scanning, via two-dimensional movement of a stage, the operating DUT with the superconducting sensor.

3. The method of claim 1, wherein the property comprises at least one of a quality factor, a resonant frequency, and a capacitance.

4. The method of claim 1, wherein the determining the property comprises:
measuring a forward gain of the superconducting sensor;
determining a resonant frequency based on the measured forward gain;
determining a quality factor and a capacitance based on the determined resonant frequency; and
determining a magnitude of the induced magnetic field based on the determined resonant frequency, the determined quality factor, and the determined capacitance.

5. The method of claim 1, wherein the superconducting sensor comprises a resonant circuit defined in a superconducting film.

6. The method of claim 5, wherein the resonant circuit includes an interdigitated capacitor and an inductor electrically coupled in parallel.

7. The method of claim 1, wherein the superconducting sensor is capacitively coupled to a transmission line transporting the injected signal.

8. The method of claim 1, wherein the injected signal comprises a broadband radio frequency range.

9. The method of claim 1, further comprising disposing the operating DUT in a vacuum chamber at a nominal operating temperature of the operating DUT.

10. The method of claim 7, wherein another superconducting sensor is capacitively coupled to the transmission line in parallel with the superconducting sensor.

11. The method of claim 10, further comprising multiplexing a collective output current of the superconducting sensor and the another superconducting sensor.

12. A system for characterizing current of an operating device under test (DUT), the system comprising:
a superconducting sensor;
a cryocooler configured to dispose the superconducting sensor in spaced relationship to the operating DUT, the spaced relationship inducing a magnetic field in the superconductor sensor;
a vacuum chamber enclosing the superconducting sensor and the operating DUT; and
a controller configured to:
inject a signal into the superconducting sensor;
determine a property of the superconducting sensor based on the injected signal;
determine a change in the property of the superconducting sensor resulting from the induced magnetic field; and
estimate current of the operating DUT based on the change in the property of the superconducting sensor,
wherein the induced magnetic field is based on the spaced relationship, current of the operating DUT, and the injected signal.

13. The system of claim 12, wherein the controller is further configured to scan, via two-dimensional movement of a stage, the operating DUT with the superconducting sensor.

14. The system of claim 12, wherein the property comprises at least one of a quality factor, a resonant frequency, and a capacitance.

15. The system of claim 12, wherein the superconducting sensor comprises a resonant circuit defined in a superconducting film.

16. The system of claim 12, wherein the resonant circuit includes an interdigitated capacitor and an inductor electrically coupled in parallel.

17. The system of claim 12, wherein the superconducting sensor is capacitively coupled to a transmission line transporting the injected signal.

18. The system of claim 12, wherein the injected signal comprises a broadband radio frequency range.

19. The system of claim 12, wherein the controller is further configured to dispose the operating DUT in a vacuum chamber at a nominal operating temperature of the operating DUT.

20. The system of claim 17, wherein another superconducting sensor is capacitively coupled to the transmission line in parallel with the superconducting sensor.

21. The system of claim 12, where the controller is further configured to multiplex a collective output current of the superconducting sensor and the another superconducting sensor.

* * * * *